United States Patent [19]

Lee et al.

[11] Patent Number: 5,968,275
[45] Date of Patent: Oct. 19, 1999

[54] METHODS AND APPARATUS FOR PASSIVATING A SUBSTRATE IN A PLASMA REACTOR

[75] Inventors: Changhun Lee, Fremont; Vikram Singh, Santa Clara; Yun-Yen Jack Yang, San Jose, all of Calif.

[73] Assignee: Lam Research Corporation, Fremont, Calif.

[21] Appl. No.: 08/882,222

[22] Filed: Jun. 25, 1997

[51] Int. Cl.[6] .................................................. C23C 16/00
[52] U.S. Cl. ...................... 118/723 R; 118/504; 156/345; 438/731
[58] Field of Search ............................... 118/723 R, 504, 118/723 E, 723 ER, 723 MW, 723 ME, 723 MR, 723 MA, 723 AN, 723 I, 723 IR; 156/345; 438/731; 204/298.02, 298.11, 298.31; 315/111.21

[56] References Cited

U.S. PATENT DOCUMENTS

| | | | |
|---|---|---|---|
| 4,534,816 | 8/1985 | Chen et al. | 156/345 |
| 4,836,902 | 6/1989 | Kalnitsky et al. | 204/192.32 |
| 5,114,529 | 5/1992 | Masuyama et al. | 156/643 |
| 5,366,557 | 11/1994 | Yu | 118/725 |
| 5,545,289 | 8/1996 | Chen et al. | 156/643.1 |
| 5,741,363 | 4/1998 | Van Buskirk et al. | 118/715 |

FOREIGN PATENT DOCUMENTS 08 031803  2/1996  European Pat. Off. .

OTHER PUBLICATIONS

Singh et al., Application of Plasma and Flow Modeling to the Design of Optimized Aluminum Equipment: Database Inspec Institute of Electrical Engineers, Stevenage, GB, 1997, Pennington, NJ, USA, Electrochem. Soc., USA, XP–002079763.

"Notification of Transmittal of the International Search Report," Oct. 26, 1998, European Patent Office.

"International Search Report," Oct. 26, 1998, European Patent Office.

*Primary Examiner*—Bruce Breneman
*Assistant Examiner*—Luz Alejandro
*Attorney, Agent, or Firm*—Beyer & Weaver LLP

[57] ABSTRACT

A plasma processing system configured for use in processing a substrate after metal etching. The substrate includes a layer of photoresist disposed thereon. The plasma processing system includes a plasma generating region and a baffle plate disposed between the plasma generating region and the substrate. The baffle plate includes a central blocked portion disposed in a center region of the baffle plate. The baffle plate further includes an annular porous portion surrounding the central blocked portion. The annular porous portion includes a plurality of through holes configured for permitting a $H_2O$ plasma generated in the plasma generating region to pass through the holes to reach a surface of the substrate. The plasma processing system also includes a chuck disposed below the baffle plate to support the substrate during the processing.

26 Claims, 6 Drawing Sheets

METHODS AND APPARATUS FOR PASSIVATING A SUBSTRATE IN A PLASMA REACTOR

BACKGROUND OF THE INVENTION

The invention relates to the fabrication of semiconductor integrated circuits (ICs). More particularly, the invention relates to apparatus and methods for passivating a semiconductor substrate after metal etching.

In semiconductor IC fabrication, devices such as component transistors are formed on a substrate, which is typically made of silicon. Uses for the substrate may include, for example, the fabrication of ICs or flat panel displays. Successive layers of various materials are deposited on the substrate to form a layer stack. Metallic interconnect lines may then be employed to couple the devices of the IC together to form the desired circuit.

To form the aforementioned metallic interconnect lines, a portion of the layers of the layer stack, including the metallization layer, may be etched after a suitable lithography technique. By way of example, one such lithography technique involves the patterning of a photoresist layer by exposing the photoresist material in a contact or stepper lithography system, and the development of the photoresist material to form a mask to facilitate subsequent etching. Using an appropriate etchant, the areas of the metallization layer unprotected by the mask may be etched away, leaving behind metallization interconnect lines or features.

Etching of the substrate may, in some cases, create volatile byproducts, which may include chloride compounds. These byproducts, including chloride compounds, may be adsorbed into the substrate during the etching process. After the etching has been completed, an ashing step may be employed to remove the photoresist layer as well as some of the chloride compounds adsorbed by the substrate during etching. In the prior art, ashing is typically accomplished in a plasma reactor system using $O_2/N_2$ as ashing source gases. The prior art plasma reactor is typically configured specifically for ashing using the aforementioned $O_2/N_2$ as ashing source gases.

The prior art ashing system may be better understood with reference to FIG. 1. In FIG. 1, there is shown a highly simplified ashing system 100 which may be suitable for stripping, for example, the photoresist layer from a wafer. A microwave source 130 generates microwaves that typically pass through a waveguide 118 and excite $O_2/N_2$ source gas input through port 102, thereby producing $O_2/N_2$ plasma and UV light.

The $O_2/N_2$ plasma and UV light pass into ashing chamber 108 and are deflected by a deflector plate 104. Deflector plate 104 typically blocks the UV light from line of sight exposure to wafer 112. As is known, the plasma's contact with deflector plate 104 may cause some of the plasma's charged species, electrons, and reactive neutral species to be recombined. Recombination may change the reactive characteristics of the plasma. By way of example, reactive neutral species that are recombined may become less reactive, thereby affecting the efficiency with which the ashing process is conducted.

After being deflected, the $O_2/N_2$ plasma continues downward into ashing chamber 108 and contacts baffle plate 110, which may cause further recombination of the reactive neutral species as well as recombination of the charged species and electrons. The remaining $O_2/N_2$ plasma diffuses through holes in baffle plate 110 and contacts wafer 112 (shown disposed on chuck 114) to ash the photoresist thereon as well as to remove some of the adsorbed chloride compounds. Any remaining $O_2/N_2$ plasma and ashing byproducts exit ashing chamber 108 through exhaust port 116.

Baffle plate 110 and deflector plate 104 in ashing chamber 108 are typically configured to evenly distribute $O_2/N_2$ plasma across the wafer 112. Deflector plate 104 may be better understood with reference to FIG. 2. In FIG. 2, there is shown a prior art deflector plate 104 which may be made of quartz or a similarly suitable material that is not readily susceptible to etching by $O_2/N_2$ plasma. In one prior art example, solid deflector plate 104 may be substantially disk shaped with a thickness of about 0.13 inch and an outer diameter of about 2 inches. Deflector plate 104 is typically sized to protect the wafer from line of sight exposure to UV light produced during $O_2/N_2$ plasma energization.

Baffle plate 110 may be better understood with reference to FIG. 3. In FIG. 3, there is shown an exemplary prior art baffle plate 110, which may be substantially disk shaped with an outer diameter of about 8.4 inches and a thickness of about 0.13 inch. Baffle plate 110 may also be made of quartz or another suitable material which is also not readily susceptible to etching by the $O_2/N_2$ plasma. The center portion of baffle plate 110 typically includes a porous region 204 having a uniform distribution of holes. In one exemplary prior art baffle plate, a typical hole 206 in porous region 204 may have an inner diameter of about 0.13 inch and may be spaced apart from other holes in porous region 204 by about 0.5 inch. The porous region may extend all the way to the periphery of baffle plate 110 or may terminate at an annular region 208. As shown in FIG. 3, annular region 208 surrounding porous region 204 may be solid and may be used to support baffle plate 110 in ashing chamber 108.

Although prior art ashing systems, e.g., ashing system 100 of FIG. 1, has proved useful in the past in removing the photoresist material and some of the adsorbed chloride compounds, they have proven to be inadequate for ashing some modem substrates. By way of example, it has been found that prior art ashing systems are inadequate in addressing corrosion problems in substrates that employ Cu as part of their metallization layer. This is because a high Cu concentration in the metallization layer tends to generate galvanic effects, which may exacerbates the interconnect line corrosion problem after etching is completed. If the adsorbed chloride compounds are inadequately removed, as has been found in substrates ashed in prior art ashing systems, the resulting IC may be rendered defective during use.

The inability of prior art ashing systems to adequately remove the absorbed $Cl_2$ also causes problems in ICs that employ fairly narrow design rules. If the interconnect lines are wide enough, some corrosion may not unduly affect the IC performance. However, modem IC circuits are scaled with increasingly narrower design rules to achieve greater circuit density. As a result, the width of the interconnect lines or the spacings between adjacent interconnect lines, have steadily decreased. By way of example, while a line width of approximately 0.8 microns ($\mu$) is considered acceptable in a 4 megabit (Mb) dynamic random access memory (DRAM) IC, 256 Mb DRAM IC's preferably employ interconnect lines as thin as 0.25 microns or even thinner. Because interconnect line widths are becoming narrower, there is less of a safety margin to deal with corrosion problems, since the thinner interconnect lines may be more easily damaged by corrosion. This is doubly true if Cu is also used in the metallization layer, for the reasons discussed earlier.

To remove more of the adsorbed chloride compounds, there is provided in the prior art a separate passivation step that may be performed before the ashing process. The passivation step removes much of the adsorbed chloride compounds to minimize the corrosion damage. To passivate the substrate, a $H_2O$ plasma is typically employed. The reaction between the reactive neutral species of the $H_2O$ plasma and the substrate removes more of the chloride compounds adsorbed by the substrate during etching, thereby minimizing corrosion damage. Passivation has been found to be useful when Cu is present in the metallization layer or when metallization lines are thin.

In the prior art, the same chamber employed for ashing is typically also employed for passivation. When prior art ashing chamber 108 is used for $H_2O$ passivation, however, it has been found that a relatively long passivation process time may be required. This is because prior art ashing chamber 108 is optimized for $O_2/N_2$ ashing, and the dual plate configuration of the prior art ashing chamber 108 results in a high degree of reactive neutral species recombination. As discussed earlier, this reduces the density of the reactive neutral species as well as the effectiveness with which the substrate may be passivated. Among other reasons, a high degree of recombination occurs because many of the reactive neutral species are recombined upon contact with the large interior surfaces of the two plates, i.e., of deflector plate 104 and baffle plate 110.

In view of the foregoing, there are desired improved apparatus and methods therefor which passivate and ash the substrate with a higher degree of efficiency. The improved apparatus and methods preferably remove a high percentage of the adsorbed $Cl_2$ to reduce the metal corrosion problem while minimizing the time required for such passivation and ashing.

SUMMARY OF THE INVENTION

The invention relates, in one embodiment, to a baffle plate configured for use in a plasma processing chamber for processing a substrate after metal etching. The substrate includes a layer of photoresist disposed thereon. The baffle plate is disposed between a plasma generating region of the plasma processing chamber and the substrate. The baffle plate includes a central blocked portion disposed in a center region of the baffle plate. The baffle plate further includes an annular porous portion surrounding the central blocked portion. The annular porous portion includes a plurality of through holes configured for permitting a $H_2O$ plasma having reactive neutral species to pass through the holes to reach a surface of the substrate.

In another embodiment, the invention relates to a method in a plasma processing chamber for processing a substrate after etching. The substrate includes a layer of photoresist disposed thereon. The method includes installing a baffle plate between a plasma generating region of the plasma processing chamber and the substrate. The baffle plate includes a central blocked portion disposed in a center region of the baffle plate, and an annular porous portion surrounding the central blocked portion. The annular porous portion includes a plurality of through holes configured for permitting reactive neutral species of a $H_2O$ plasma to pass through the holes to reach a surface of the substrate.

The method further includes flowing $H_2O$ vapor into the plasma processing chamber. The method also includes striking the $H_2O$ plasma from the $H_2O$ vapor. There is further included processing the substrate with the $H_2O$ plasma.

In yet another embodiment, the invention relates to a plasma processing system configured for use in processing a substrate. The substrate includes a layer of photoresist disposed thereon. The plasma processing system includes a plasma generating region and a baffle plate disposed between the plasma generating region and the substrate. The baffle plate includes a central blocked portion disposed in a center region of the baffle plate. The baffle plate further includes an annular porous portion surrounding the central blocked portion. The annular porous portion includes a plurality of through holes configured for permitting a $H_2O$ plasma generated in the plasma generating region to pass through the holes to reach a surface of the substrate. The plasma processing system also includes a chuck disposed below the baffle plate to support the substrate during the processing.

These and other features of the present invention will be described in more detail below in the detailed description of the invention and in conjunction with the following figures.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Figure 1:
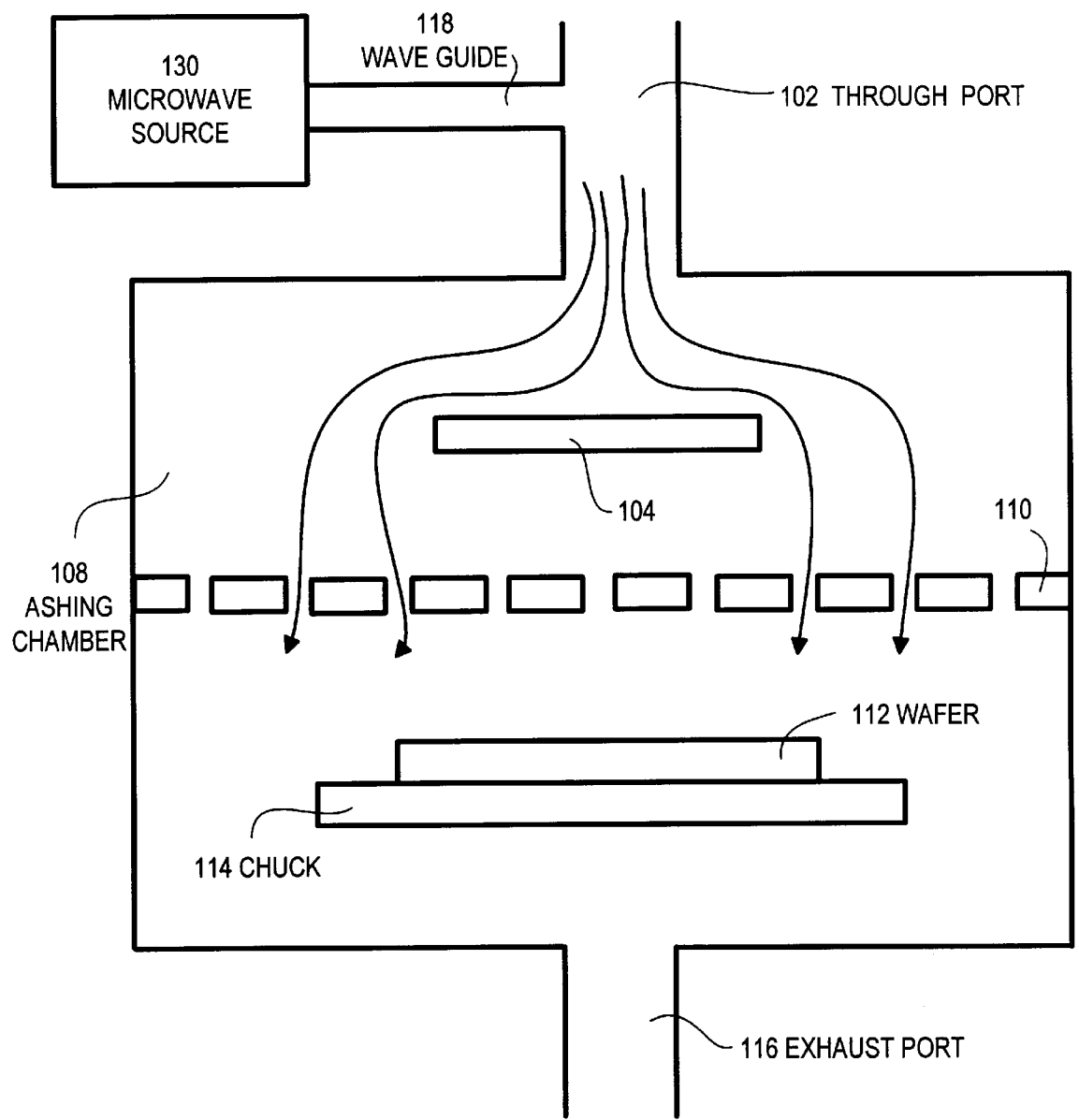
FIG. 1 illustrates, to facilitate discussion, a highly simplified prior art ashing system 100.

In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one aspect of the present invention, the inventive apparatus significantly improves the passivation efficiency of a substrate by increasing the reactive neutral density at the substrate surface. Because the inventive passivation apparatus involves minimizing the internal surface area that is available for reactive neutral species recombination within the plasma processing chamber, fewer reactive neutral species may recombine prior to reaching the substrate surface. When fewer reactive neutral species recombine, the reactive neutral density at the substrate surface may be increased, leading to improvement in the passivation efficiency.

In accordance with another aspect of the present invention, the inventive baffle plate results in a more even distribution of the reactive neutral species across the substrate. In accordance with this aspect, the inventive baffle plate includes a solid central area, which is surrounded by a porous area. The reactive neutral species may pass around the solid area and through the porous area of the inventive baffle plate on their way to the wafer in such a manner that a more uniform density of reactive neutral species may be formed across the substrate surface.

The inventive passivation technique may be performed in any known plasma processing chamber, including those utilizing microwave. Other ashing systems may equally be utilized so long as they are capable of generating a $H_2O$ plasma. By way of example, it is contemplated that other RF systems may also be employed.

To further elaborate on the features and advantages of the present invention, it may be useful to consider the mechanism by which recombination occurs. The $H_2O$ plasma generated by the plasma reactors may consist of charged species, neutral species and electrons. It is believed that the most active passivation elements of the $H_2O$ plasma may be the reactive neutral species, which include O, OH and H. It is believed that the O reactive neutral species react with the carbon atoms on the substrate to form $CO_2$, and that the H reactive neutral species react with the Cl molecules in the substrate to form HCl during passivation In general, passivation efficiency is increased with higher reactive neutral species densities.

As stated earlier, however, the reactive neutral species density may be reduced by recombination upon contact with an interior surface of the plasma processing chamber. The recombination of reactive neutral species forms molecules that may less actively passivate a substrate. Examples of reactive neutral species recombination reactions may include, for example: $H+O=OH$, $O+O=O_2$, $H+H=H_2$, $HO+H=H_2O$ Since the recombined molecules tend to be less active in passivation, it is generally desirable to minimize recombination of reactive neutral species. By minimizing the internal surface area that contacts the plasma on its way to the substrate, the inventive passivation technique advantageously minimizes the recombination of reactive neutral species, thereby improving the passivation rate.

Figure 4:
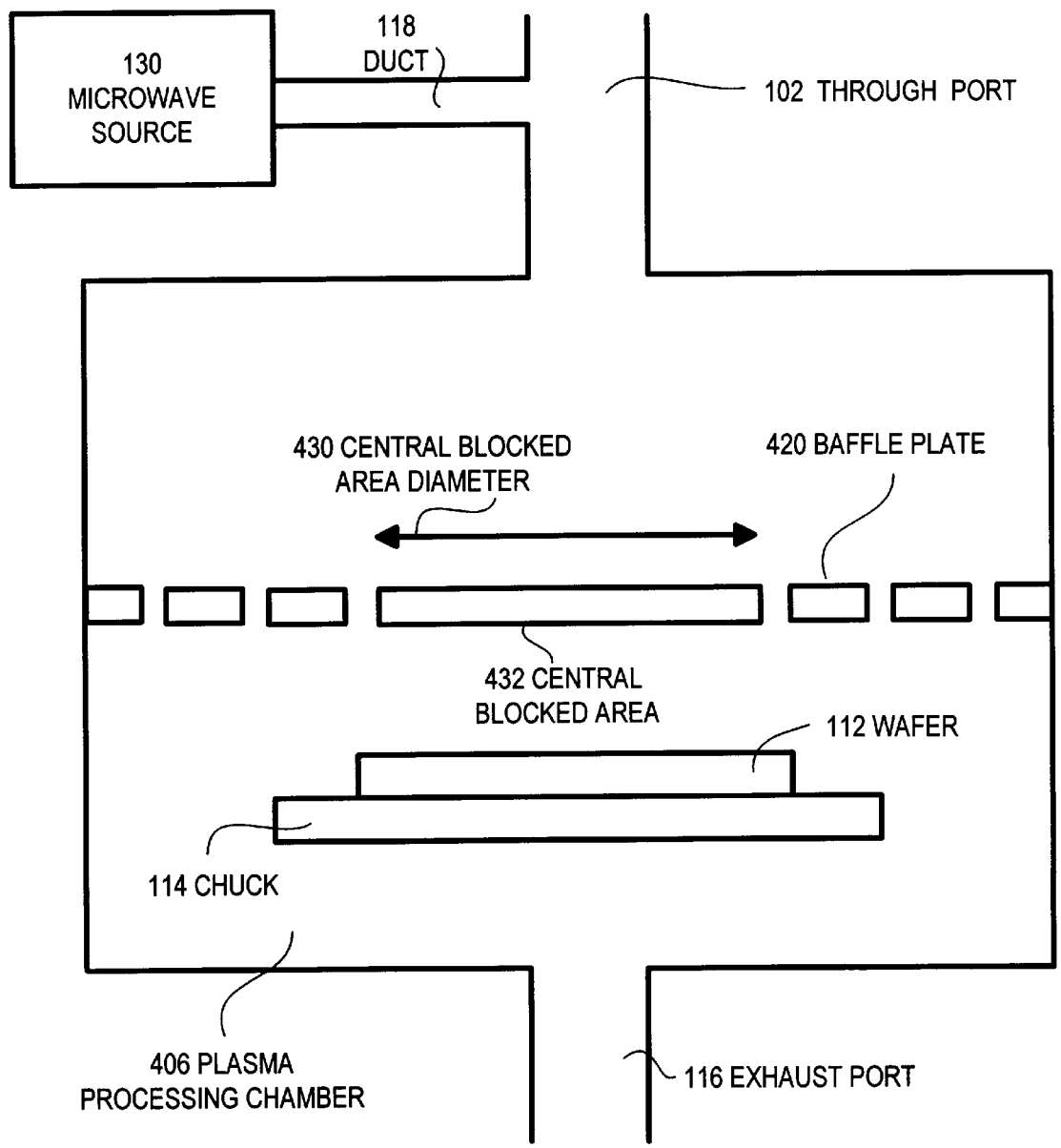
FIG. 4 illustrates, in accordance with one embodiment of the present invention, a simplified schematic of the inventive plasma passivation chamber.

FIG. 4 illustrates a simplified schematic of a plasma passivation chamber 406 that is suitable for implementing the inventive passivation technique. In FIG. 4, elements having like reference numbers with elements of FIG. 1 generally perform the same function. However, plasma passivation chamber 406 differ from prior art plasma processing system 100 in many different ways. For one, plasma passivation chamber 406 is now optimized for $H_2O$ plasma passivation. As another example, plasma passivation chamber 406 preferably employs a single inventive baffle plate 420 instead of the dual plate arrangement (plates 104 and 110) of FIG. 1.

In FIG. 4, the $H_2O$ vapor is excited into a plasma in port 102. Port 102, and specifically the lower portion thereof, may be thought of as the plasma generating region since this represents the region wherein the majority of the plasma species are formed via microwave excitation. The $H_2O$ plasma contacts baffle plate 420 on its way toward substrate 112. Baffle plate 420 is, in this example, 8.4 inches wide and is located 3.7 inches from port 102. Some of the charged species and electrons as well as some of the reactive neutral species from the $H_2O$ plasma may recombine upon contact with surfaces of baffle plate 420. A substantial percentage of the reactive neutral species, however, pass through the pores of baffle plate 420 to form a substantially uniform concentration of reactive neutral species at the surface of substrate 112. The $H_2O$ plasma species react with the substrate's surface to passivate, e.g., remove the adsorbed chloride compounds, thereby lessening corrosion damage.

As will be discussed in detail herein, inventive baffle plate 420 includes a central blocked area which is surrounded by a substantially porous area. The porous area permits the aforementioned $H_2O$ plasma to pass through while the central blocked area deflects the concentrated jet of hot plasma material out of the plasma generating region (e.g., the lower portion of port 102), thereby preventing this concentrated hot jet of plasma from excessively passivating only central portion of the substrate.

The central blocked area also prevents the UV light from directly impinging on substrate 112. In this manner, the central blocked area of baffle plate 420 helps prevent substrate 112 from direct line of sight UV damage during passivation. UV light may damage the substrate 112 by hardening the photoresist during passivation, which may make the photoresist more difficult to remove during a subsequent photoresist removal step.

Figure 5:
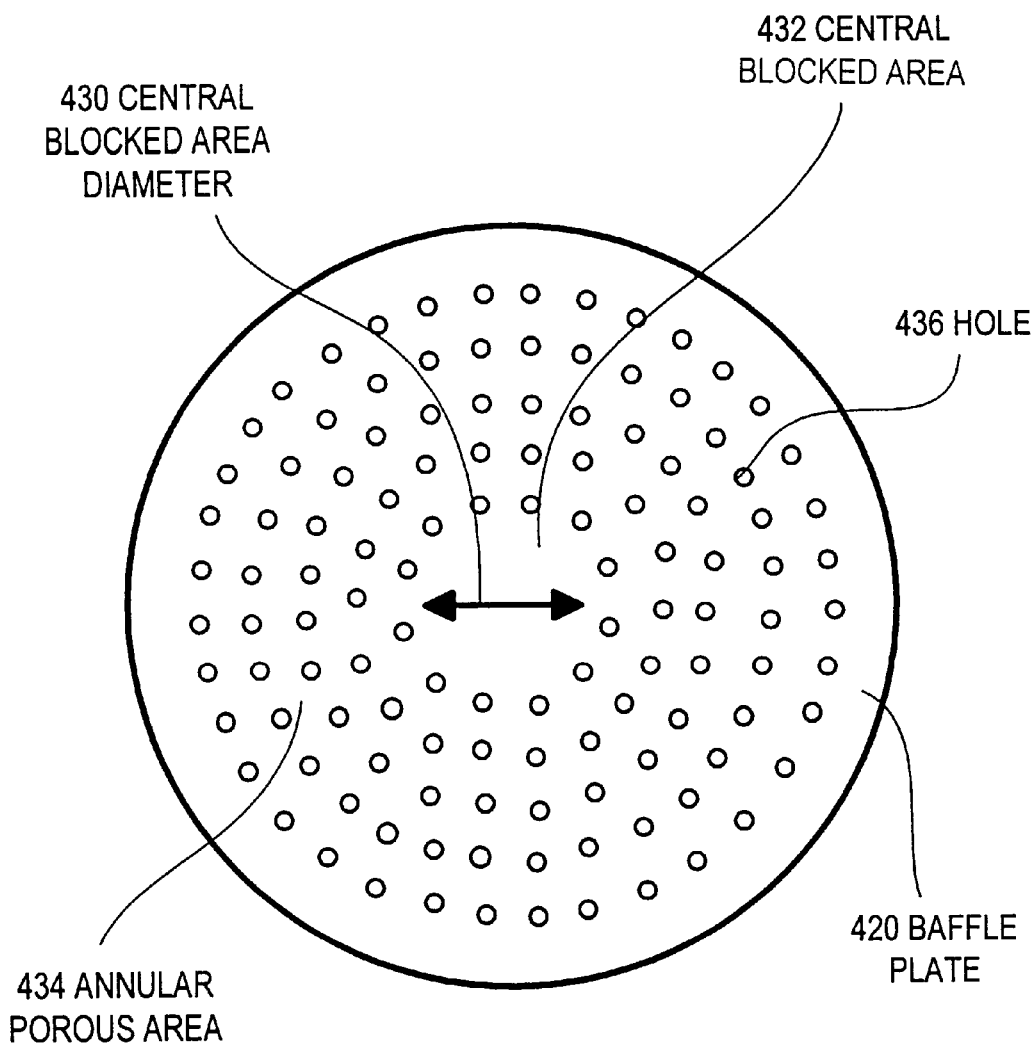
FIG. 5 illustrates, in accordance with one embodiment of the present invention, the inventive baffle plate.

The inventive baffle 420 plate may be better understood with reference to FIG. 5. In FIG. 5, there is shown a baffle plate 420 which may be substantially disk shaped and may be made of quartz or another suitable material which is not readily attacked by the passivation plasma. The baffle plate 420 has a central blocked area 432 which may be solid and circular in shape as well as an annular porous area 434 which surrounds the central blocked area 432. The central blocked area 432 has a diameter 430 which may be sized as appropriate to deflect the plasma out of port 102 and/or block UV light from line of sight exposure to substrate 112, taking into account its distance from the port of the plasma passivation chamber (e.g., from port 102) and/or its distance from the substrate.

To further elaborate, the UV light produced during plasma energization typically radiates from port 102 (i.e., the plasma generating region) into plasma passivation chamber 406. Because some of the UV light may radiate downward and outward, the shadow within plasma passivation chamber 406 that is cast by the central blocked area 432 may be larger in size than the central blocked area itself. The size of the shadow cast by the central blocked area may be inversely proportional with the distance between the central blocked area and the UV source. Further, the size of the shadow is typically directly proportional to the distance between the shadow and the central blocked area. Still further, the size of the shadow typically varies in direct proportion with the size of the central blocked area itself. Accordingly, the appropriate size of central blocked area 432 is determined, in part, by these factors.

In one embodiment, the annular porous area 434 surrounding the central blocked area 432 may consist of a multiplicity of holes. A typical hole 436 may have a constant diameter and may be drilled straight through baffle plate 420. The holes themselves may be arranged in any pattern, e.g., radial, linear, or a combination thereof. In one embodiment, the dimension of the holes is such that when baffle plate 420 is positioned within the plasma passivation chamber, any UV light that enters the holes from the top will preferably strike the inner walls of the holes without directly impinging on the substrate surface. This feature permits the central blocked area to be sized smaller than required to cast a shadow over the entire surface. The holes permit the plasma to pass through but block substantially all UV light from reaching the surface of substrate 112. As mentioned, a portion of this UV light is already blocked by the central blocked area of the baffle plate itself. Because of this, substrate 112 may be positioned directly under baffle plate 420 without suffering from direct line of sight UV exposure damage, even if a separate deflection plate of the prior art is not employed.

Compared to prior art FIG. 1, for example, the inventive baffle plate minimizes the interior surface area available for recombination since only a single plate is employed. Accordingly, the surface area of prior art deflection plate is completely eliminated. Further, the reduction or elimination of holes in the central blocked portion of the single baffle plate of the invention also contributes to the reduction in the available surface area for recombination. In other words, the use of the inventive plate, in a nonobvious manner, yields a greater reduction in surface area than that achieved by merely eliminating the prior art deflection plate. With less recombination area, a higher density of reactive neutral species may reach the substrate surface, resulting in a faster passivation rate and a higher throughput.

The inventive process may also improve passivation uniformity by dispersing reactive neutral species more evenly across the surface of substrate 112. It has been thought heretofore that a plate with holes throughout, e.g., prior art baffle plate 10, would result in a more even distribution of the reactive neutral species across the surface of the substrate. Accordingly, such plates have often been used in the past, often in conjunction with a deflection plate (the combination of which disadvantageously contributes to the high recombination surface area).

It has been found that the invention surprisingly yields, in some cases, a more even distribution of the reactive neutral species. It may be seen from FIG. 4 that the reactive neutral species flowing from the plasma source, e.g., port 102, are deflected around the central blocked area 432 of the baffle plate 420 and pass through the annular porous area 434 to the substrate 112. It is believed that since the deflecting central blocked portion is co-planar with the porous portion, improved distribution of the plasma at the substrate surface is achieved. It is further believed that the flow of plasma around the central blocked area 432 may draw the reactive neutral species under the center of the baffle plate 420, resulting in a more even plasma density at the surface of the substrate.

As stated, one benefit of the improved passivation non-uniformity is improved chloride compounds removal. As another benefit, the inventive passivation apparatus may render the photoresist more readily stripped in a subsequent ashing step. This is because some stripping of the photoresist already occurred during passivation. When the passivation is more uniform, as in the case with the inventive passivation technique, the substrate may be more uniformly stripped, and a more uniform photoresist thickness may exist across the substrate after passivation. When the photoresist layer thickness is uniform, it is more likely that all of the photoresist may be removed during a subsequent ashing step along with the chlorine compounds adsorbed by the photoresist.

The specific processing parameters and conditions suitable for employing the inventive passivation technique depend in part on the specific type and geometry of the plasma passivation chamber. For one example, Table 1 summarizes the possible approximate dimensions of the inventive baffle plate for use in the inventive passivation technique when passivating an eight inch silicon wafer (200 mm in diameter) having a photoresist layer in a 9600SE™ or 9600PTX™ plasma passivation chamber. For the dimensions of Table 1, the baffle plate itself has a diameter of about 8 inches and preferably of about 8.3 inches. The baffle plate has a thickness between about 0.1 inch and about 0.2 inch, and preferably of about 0.13 inch. These values are, however, exemplary only and may vary for different chambers, reactor types, and/or substrate types. Applicants have not tested all the variations of the following ranges. However, these ranges may be suitable for practicing the invention in the above-discussed chamber for the above-discussed wafer.

TABLE 1

Baffle Plate Parameters

|  | Suitable Range (inch) | Preferred Range (inch) | More Preferred Range (inch) |
| --- | --- | --- | --- |
| Hole Size | 0.06–0.3 | 0.1–0.25 | 0.125 |
| Distance between holes | 0.25–1.5 | 0.5–1.0 | 0.79 |
| Diameter of central blocked area | 1.0–4.0 | 1.5–3.5 | 2.94 |
| Distance between baffle plate and substrate | 0.5–3.0 | 0.8–2.0 | 1.4 |

EXAMPLES

For comparison purpose, the following experiment was conducted to assess the improvement in photoresist strip rate and uniformity due to the inventive passivation technique. It should be borne in mind that the example given below is merely illustrative of one application of the inventive passivation technique and should in no way be construed to limit the usefulness of the invention when applied with other substrates, layer stack structures, and/or passivation systems.

An eight-inch silicon wafer was used for this experiment. For testing purposes, a blanket-deposited 17,000 angstrom thick G-Line™ photoresist layer was used with no pattern etched on the substrate. The wafer in these experiments was processed in the aforementioned 9600PTX™ plasma passivation chamber. $H_2O$ vapor was utilized as the passivation process gas with a flow rate of about 750 sccm. The chamber pressure was maintained at about 2.0 Torr throughout the 15 second passivation duration. The wafer temperature was maintained at about 275 degrees C. and the microwave power was maintained at about 1,000 watts.

Figure 2:
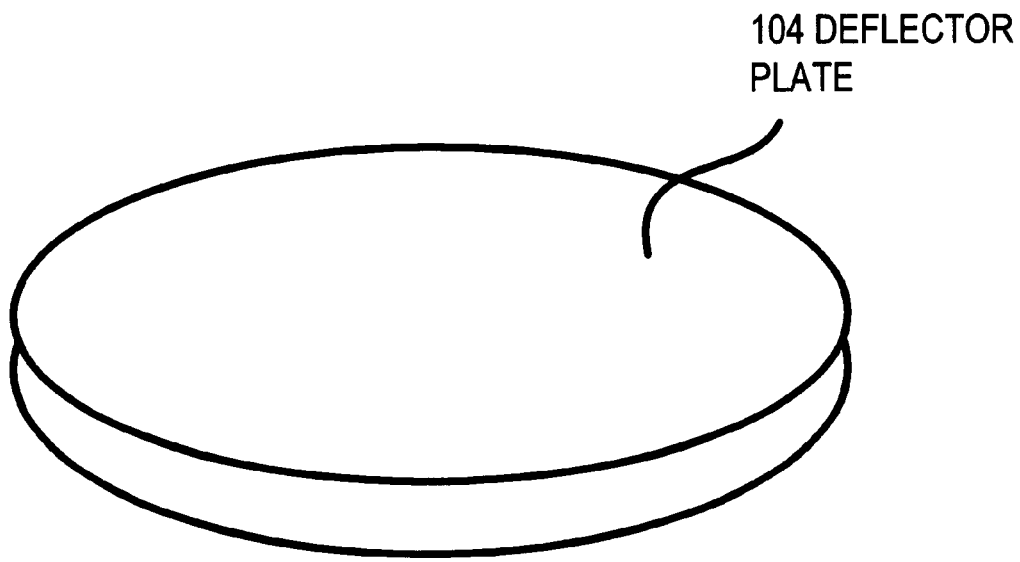
FIG. 2 illustrates a prior art deflector plate.
Figure 3:
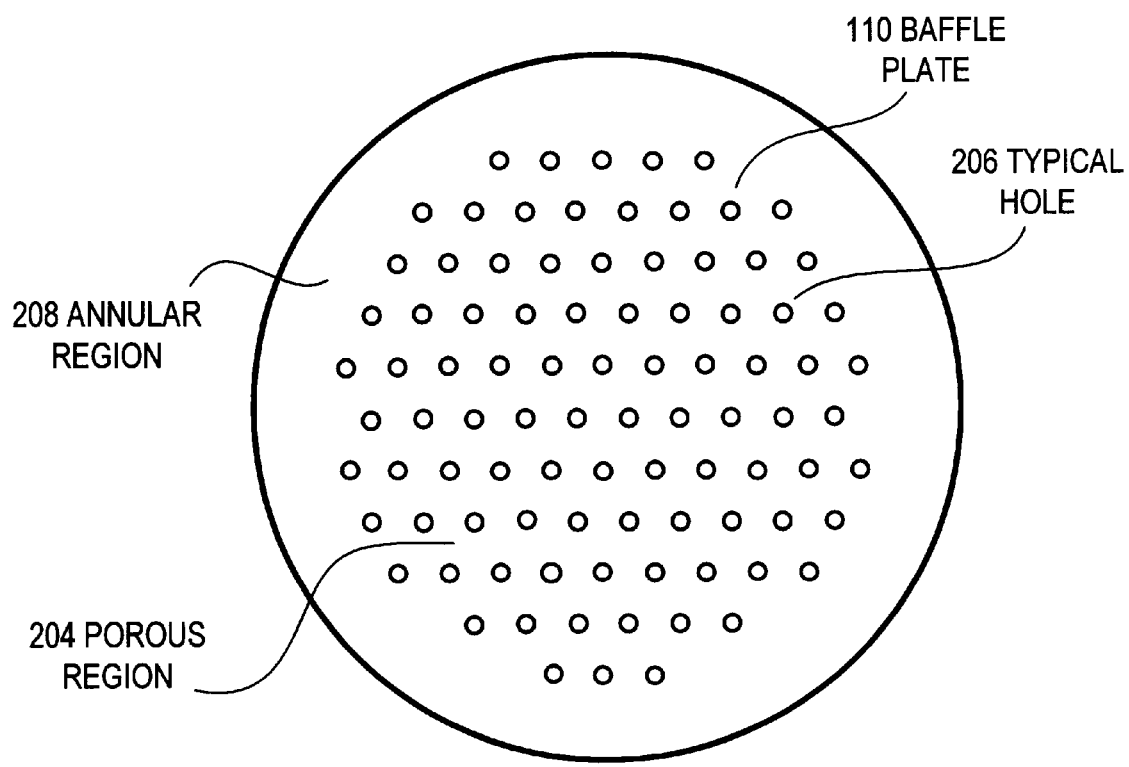
FIG. 3 illustrates a prior art baffle plate for use with the prior art deflector plate.

The wafer passivated in accordance with one embodiment of the inventive technique was processed in the described plasma passivation chamber configured with the single baffle plate described in FIGS. 4 and 5. The wafer passivated in accordance with the prior art technique was tested in the described plasma passivation chamber but with the prior art dual plate arrangement, i.e., the deflector and baffle plates described in FIGS. 2, 3A and 3B. The approximate process results of this passivation experiment are summarized as follows in Table 2.

TABLE 2

|  | Inventive technique | Prior Art technique |
| --- | --- | --- |
| Strip Rate | 0.72 μ/min. | 0.65 μ/min |
| Non-Uniformity | 3% | 18% |

As shown in Table 2, the inventive passivation technique achieved a commercially advantageous strip rate of 0.72μ/min as compared to the prior art strip rate of 0.65μ/min. Because material is removed at a faster rate, throughput may be improved by using the inventive technique. The inventive technique achieves a nonuniformity of less than 3% using the One-Sigma method as compared to a nonuniformity of about 18% when the prior art technique was performed. To clarify, the One-Sigma method provides a relative nonuniformity percentage, which is determined by comparing the substrate thickness at 49 predefined measurement points before and after the substrate has been processed.

Figure 6:
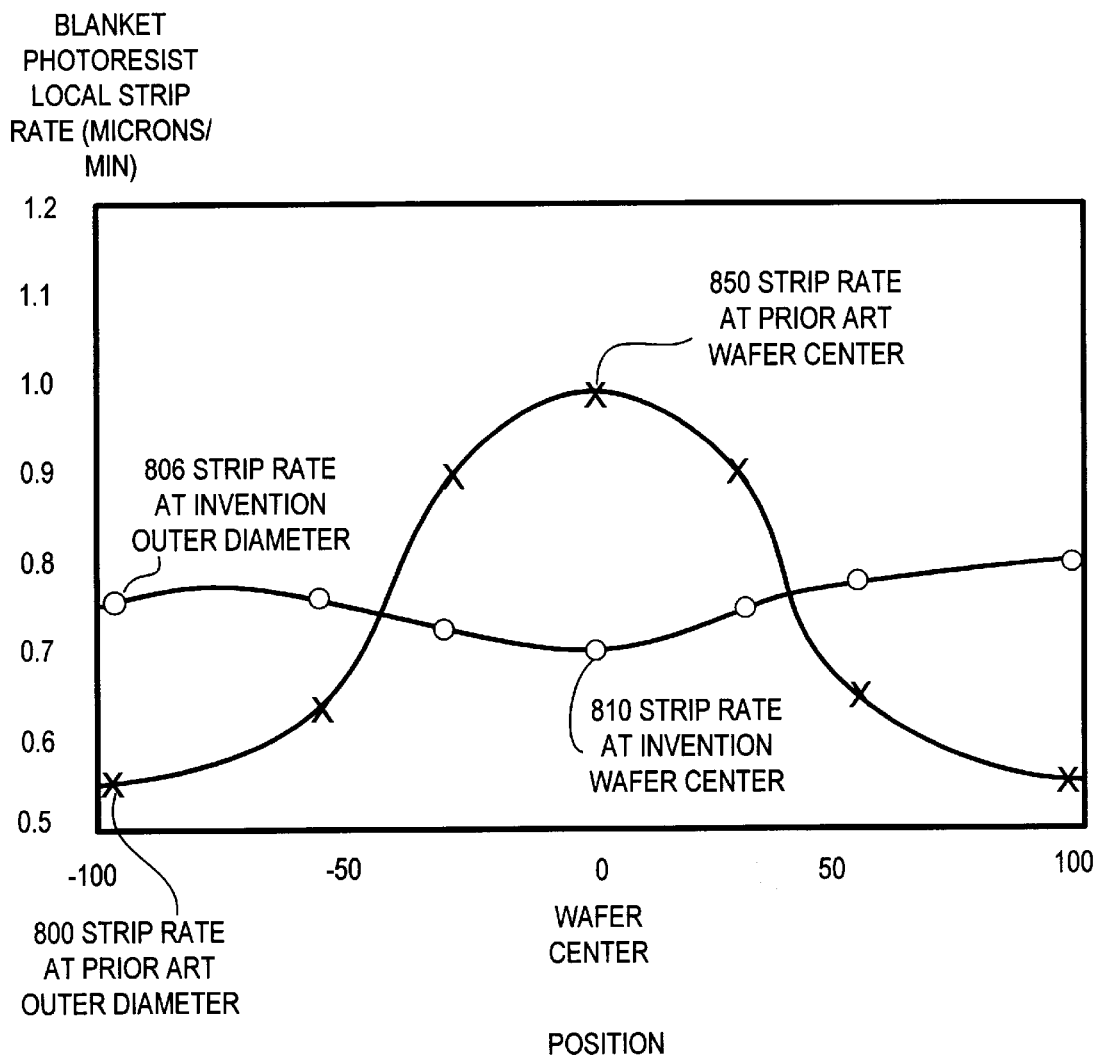
FIG. 6 depicts a graph of the local strip rate v. the position across a test wafer to illustrate the improvement in strip rate nonuniformity for $H_2O$ passivation.

The stripping uniformity improvement is illustrated with reference to FIG. 6. In FIG. 6, there is shown a graph of the local strip rate v. the position across the test wafer in one experiment. The prior art local strip rate at the wafer center 850 is approximately $0.92\mu$/min., while the local strip rate at the outer diameter 800 is approximately $0.54\mu$/min. Because there is a wide variation in strip rates across the wafer diameter, the uniformity of prior art technique is relatively poor, e.g., 18% nonuniformity in the previous example.

In contrast, the inventive technique yields a local strip rate at the wafer center 810 of approximately $0.69\mu$/min. and the strip rate at the outer diameter 806 is shown to be approximately $0.75\mu$/min. The lower differential in the strip rates across the wafer diameter results in an improved uniformity, e.g., 3% in the previous example.

Another benefit of using the inventive baffle plate with a central blocked area in the inventive passivation technique is the uniform heating of the substrate during passivation. If a baffle plate that has holes across the entire surface had been employed instead, the hot jet of $H_2O$ plasma would be permitted to pass straight down through the holes located beneath the plasma source (typically the holes located at the center of the baffle plate). If the hot jet of $H_2O$ plasma is permitted to impinge on the substrate at the center more than on periphery areas of the substrate, the substrate center may be heated more than the periphery areas. As a result, the surface temperature across the substrate surface becomes uneven, which leads to non-uniform stripping and passivation of the substrate.

By blocking the hot jet of $H_2O$ plasma from flowing directly down to the substrate center, the inventive passivation arrangement allows the $H_2O$ plasma to be more uniformly distributed across the substrate. As a result, the stripping and passivation of the substrate are made more uniform.

While the invention has been described in terms of several preferred embodiments, there are alterations, permutations, and equivalents which fall within the scope of this invention. It should also be noted that there are many alternative ways of implementing the techniques of the present invention. It is therefore intended that the following appended claims be interpreted as including all such alterations, permutations, and equivalents which fall within the true spirit and scope of the present invention.

What is claimed is:

1. A baffle plate configured for use in a plasma processing chamber for processing a substrate, said substrate including a layer of photoresist disposed thereon, said baffle plate being disposed between a plasma generating region of said plasma processing chamber and said substrate, comprising:

a central blocked portion disposed in a center region of said baffle plate; and an annular porous portion surrounding said central blocked portion, said annular porous portion including a plurality of through holes configured for permitting a $H_2O$ plasma comprising reactive neutral species to pass through said holes to reach a surface of said substrate.

2. The baffle plate of claim 1 wherein said $H_2O$ plasma is sustained by a microwave source of said plasma processing chamber.

3. The baffle plate of claim 1 wherein said central blocked portion is sized to block substantially all ultraviolet rays originated from said plasma generating region from directly impinging on said surface of said substrate during said processing.

4. The baffle plate of claim 1 wherein said central blocked portion is configured for deflecting a portion of said $H_2O$ plasma out of said plasma generating region from directly impinging on said substrate.

5. The baffle plate of claim 1 wherein said baffle plate is configured to permit said processing to occur without requiring use of a separate deflection plate.

6. The baffle plate of claim 1 wherein baffle plate is configured to be located about 3 inches from said plasma generating region during said processing.

7. The baffle plate of claim 1 wherein at least some of said holes have an inner diameter of between about 0.006 inch and about 0.3 inch.

8. The baffle plate of claim 7 wherein a diameter of said central blocked portion is between about 1 inch and about 4 inches.

9. The baffle plate of claim 8 wherein a diameter of said baffle plate is about 8 inches.

10. The baffle plate of claim 1 wherein said substrate is employed in integrated circuit manufacture.

11. In a plasma processing chamber, a method for passivating a substrate after etching, said substrate including a layer of photoresist disposed thereon, comprising:

installing a baffle plate between a plasma generating region of said plasma processing chamber and said substrate, said baffle plate including, a central blocked portion disposed in a center region of said baffle plate; and an annular porous portion surrounding said central blocked portion, said annular porous portion including a plurality of through holes configured for permitting a $H_2O$ plasma comprising reactive neutral species to pass through said holes to reach a surface of said substrate; and flowing $H_2O$ vapor into said plasma processing chamber; striking said $H_2O$ plasma from said $H_2O$ vapor; and passivating said substrate with said $H_2O$ plasma.

12. The method of claim 11 wherein said striking is performed with a microwave source.

13. The method of claim 11 wherein said central blocked portion is sized to block substantially all ultraviolet rays originated from said $H_2O$ plasma from directly impinging on said surface of said substrate during said passivation.

14. The method of claim 11 wherein said central blocked portion is configured for deflecting a portion of said $H_2O$ plasma out of said plasma generating region from directly impinging on said substrate.

15. The method of claim 11 wherein said baffle plate is configured to permit said passivation to occur without requiring use of a separate deflection plate.

16. The method of claim 11 wherein at least some of said holes have an inner diameter of between about 0.006 inches and about 0.3 inches.

17. The method of claim 16 wherein a diameter of said central blocked portion is between about 1 inch and about 4 inches.

18. The method of claim 17 wherein a diameter of said baffle plate is about 8 inches.

19. The method of claim 11 wherein said substrate is employed in integrated circuit manufacture.

20. The method of claim 11 wherein said etching represents etching with a chlorine-containing etchant while said layer of photoresist is disposed on said substrate.

21. A baffle plate configured for use in processing a substrate in a plasma processing chamber, said substrate including a layer of photoresist disposed thereon, said baffle plate being disposed between a plasma generating region of said plasma processing chamber and said substrate, comprising:

means disposed in a center region of said baffle plate for deflecting a H₂O plasma generated in said plasma generating region from directly impinging on a surface of said substrate; and an annular porous means surrounding said deflecting means, said annular porous means including a plurality of through holes configured for permitting a H₂O plasma to pass through said holes to reach said surface of said substrate.

22. The baffle plate of claim 21 wherein said central blocked means is further configured for blocking ultraviolet rays generated in said plasma generating region from directly impinging on said surface of said substrate.

23. The baffle plate of claim 21 wherein said H₂O plasma is sustained by a microwave source coupled with said plasma processing chamber.

24. A plasma processing system configured for use in passivating a substrate, said substrate including a layer of photoresist disposed thereon, comprising:

a plasma generating region;

a baffle plate disposed between said plasma generating region and said substrate, said baffle plate including:

a central blocked portion disposed in a center region of said baffle plate; and an annular porous portion surrounding said central blocked portion, said annular porous portion including a plurality of through holes configured for permitting a H₂O plasma generated in said plasma generating region to pass through said holes to reach a surface of said substrate; and a chuck disposed below said baffle plate to support said substrate during said passivation.

25. The plasma processing system of claim 24 further comprising a microwave source for sustaining said H₂O plasma during said passivation.

26. The plasma processing system of claim 25 wherein said central blocked region is configured for preventing ultraviolet rays generated within said plasma generating region from directly impinging on said substrate during said passivation.

* * * * *